(12) United States Patent
Senapati et al.

(10) Patent No.: US 12,557,298 B2
(45) Date of Patent: Feb. 17, 2026

(54) RESISTIVE RANDOM ACCESS MEMORY ON A BURIED BITLINE

(71) Applicant: International Business Machines Corporation, Armonk, NY (US)

(72) Inventors: Biswanath Senapati, Mechanicville, NY (US); Nicholas Anthony Lanzillo, Wynantskill, NY (US); Lawrence A. Clevenger, Saratoga Springs, NY (US); Albert M. Chu, Nashua, NH (US); Ruilong Xie, Niskayuna, NY (US); Seiji Munetoh, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 673 days.

(21) Appl. No.: 18/069,769

(22) Filed: Dec. 21, 2022

(65) Prior Publication Data

US 2024/0215266 A1 Jun. 27, 2024

(51) Int. Cl.
H10B 63/00 (2023.01)
(52) U.S. Cl.
CPC ............ H10B 63/80 (2023.02); H10B 63/30 (2023.02)
(58) Field of Classification Search
CPC .............................. H10B 63/30; H10B 63/80
See application file for complete search history.

(56) References Cited

U.S. PATENT DOCUMENTS

| | | | |
|---|---|---|---|
| 6,060,357 A | 5/2000 | Lee | |
| 6,127,228 A | 10/2000 | Lee | |
| 6,222,769 B1 | 4/2001 | Maruyama et al. | |
| 6,437,388 B1 | 8/2002 | Radens et al. | |
| 7,538,411 B2 | 5/2009 | Willer et al. | |
| 7,916,529 B2 | 3/2011 | Lo et al. | |
| 8,022,462 B2 | 9/2011 | Kwon | |
| 8,598,011 B2 | 12/2013 | Song et al. | |
| 9,153,590 B2 | 10/2015 | Lim et al. | |
| 9,780,145 B2 | 10/2017 | Chang et al. | |
| 9,837,422 B2 | 12/2017 | Kim et al. | |
| 10,916,583 B2 | 2/2021 | Wang | |
| 2008/0265303 A1 | 10/2008 | Kwon | |
| 2020/0303460 A1 | 9/2020 | Yao et al. | |
| 2021/0202504 A1 | 7/2021 | Chang et al. | |

(Continued)

FOREIGN PATENT DOCUMENTS

| | | |
|---|---|---|
| CN | 208655642 U | 3/2019 |
| CN | 120513699 A | 8/2025 |
| DE | 102007054641 A1 | 5/2009 |

(Continued)

OTHER PUBLICATIONS

Intellectual Property Office, Patents Act 1977: Search Report under Section 17(5), Aug. 19, 2025, 5 Pages, GB Application No. 2510091.8.

(Continued)

*Primary Examiner* — Mark V Prenty
(74) *Attorney, Agent, or Firm* — Scully, Scott, Murphy & Presser, P.C.; Yuanmin Cai

(57) ABSTRACT

A semiconductor structure is provided that includes a resistive random access memory located on a surface of a bitline that is embedded in a shallow trench isolation structure. The structure can further include a source line that is present above the bitline or embedded in the shallow trench isolation structure.

20 Claims, 11 Drawing Sheets

(56) References Cited

U.S. PATENT DOCUMENTS

2024/0215266 A1* 6/2024 Senapati ............... H10B 63/80

FOREIGN PATENT DOCUMENTS

| WO | 2019/097341 A1 | 5/2019 |
| WO | 2021260377 A1 | 12/2021 |
| WO | 2024/131451 A1 | 6/2024 |

OTHER PUBLICATIONS

International Search Report dated Feb. 8, 2024, received in a corresponding foreign application, namely International Patent Application No. PCT/CN2023/134362, 8 pages.

* cited by examiner

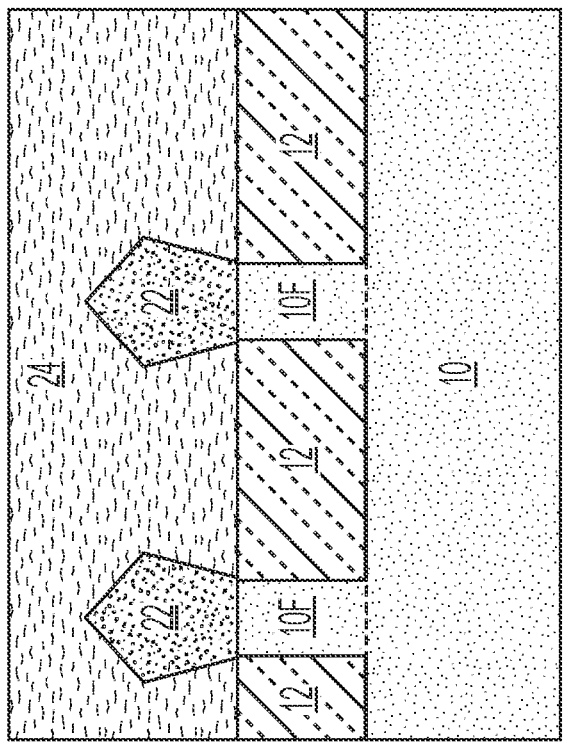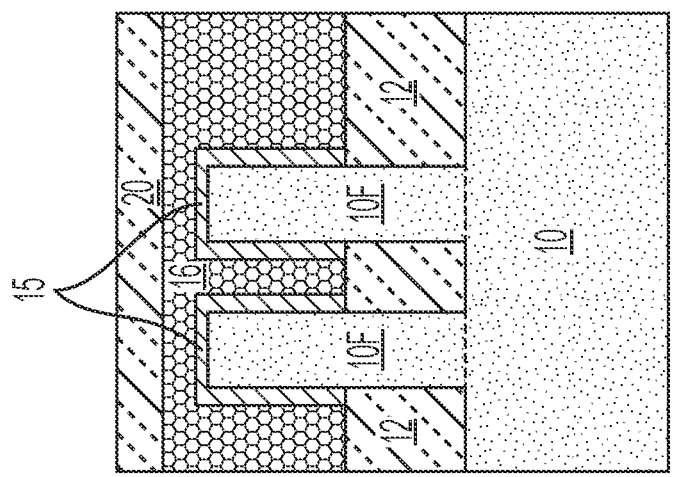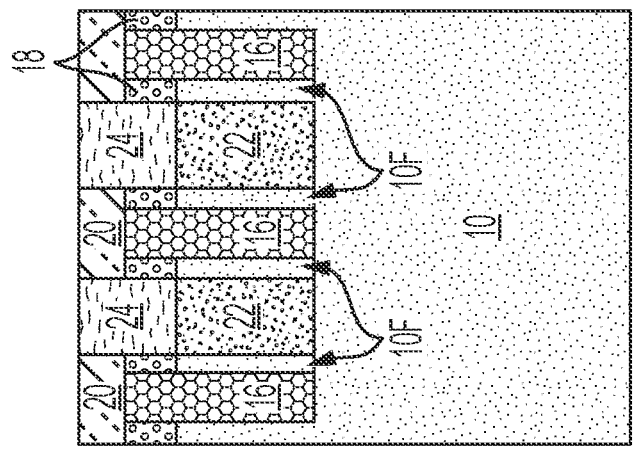
FIG. 2C
FIG. 2B
FIG. 2A

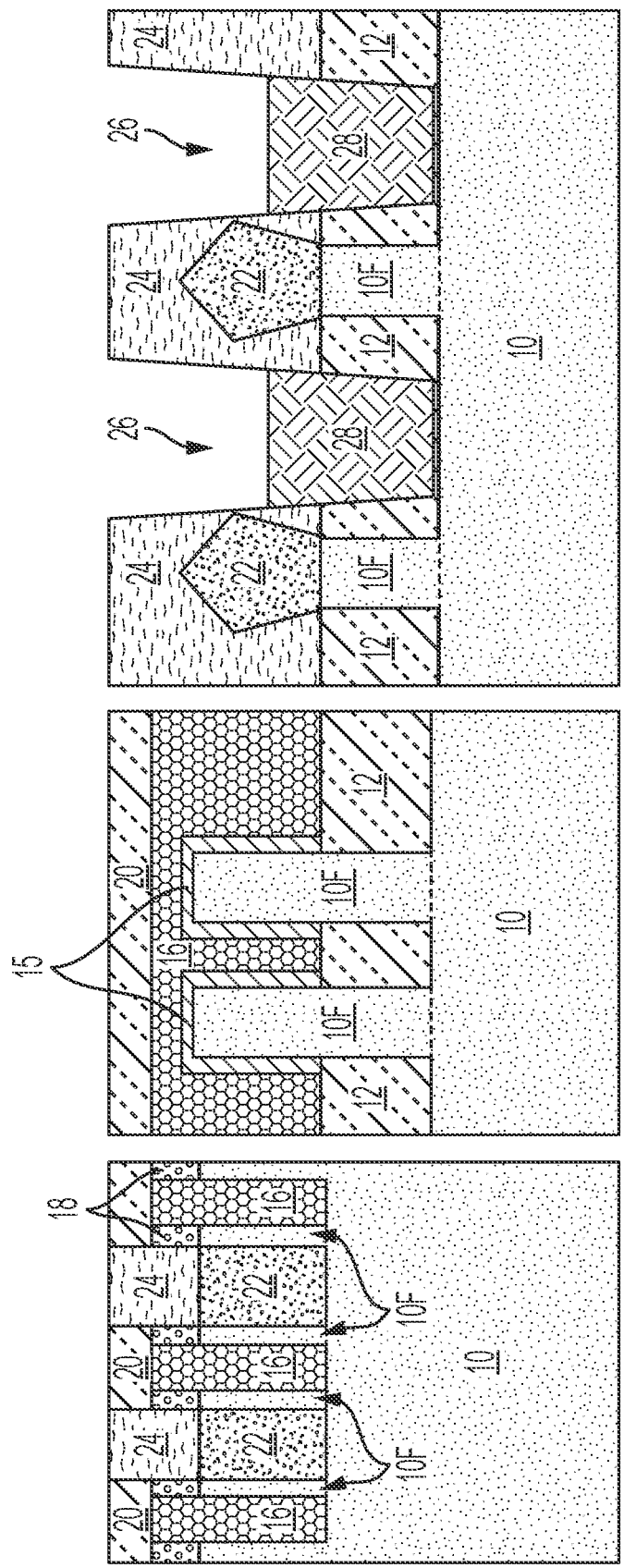

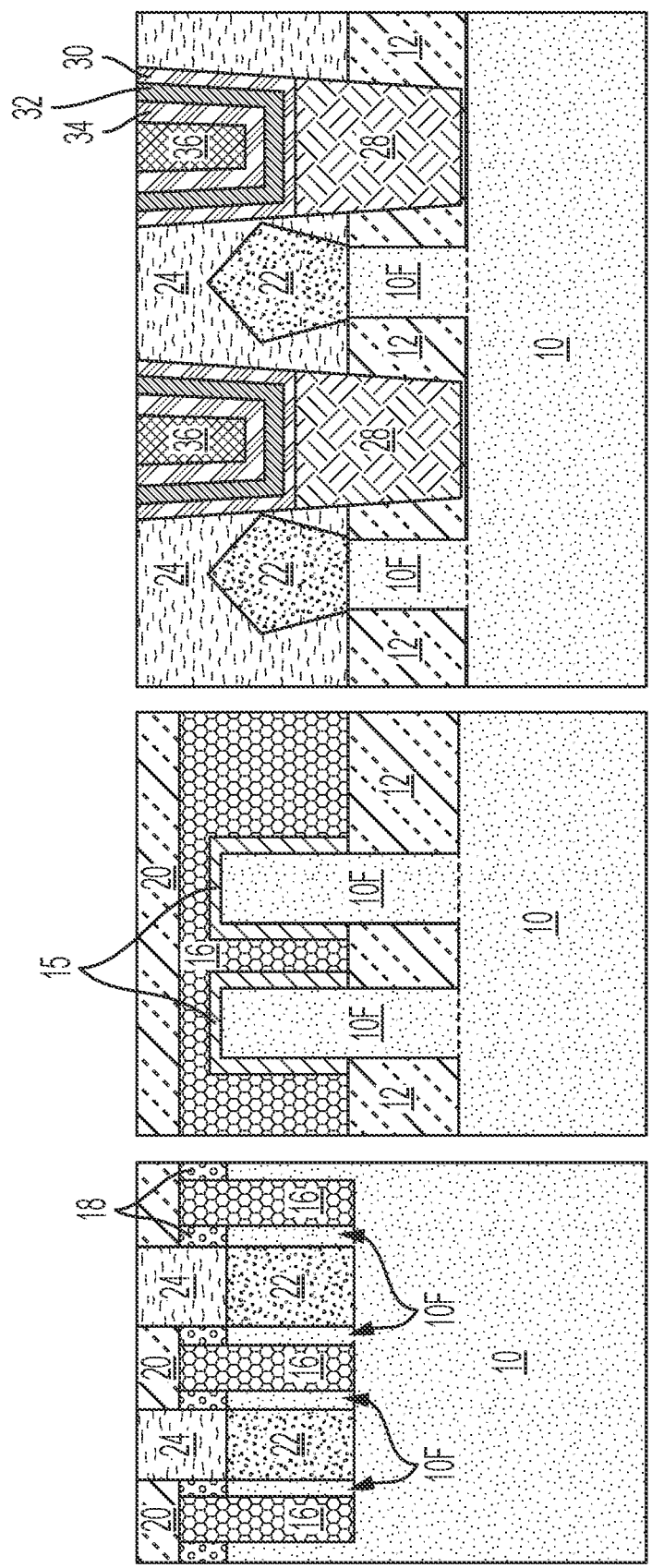

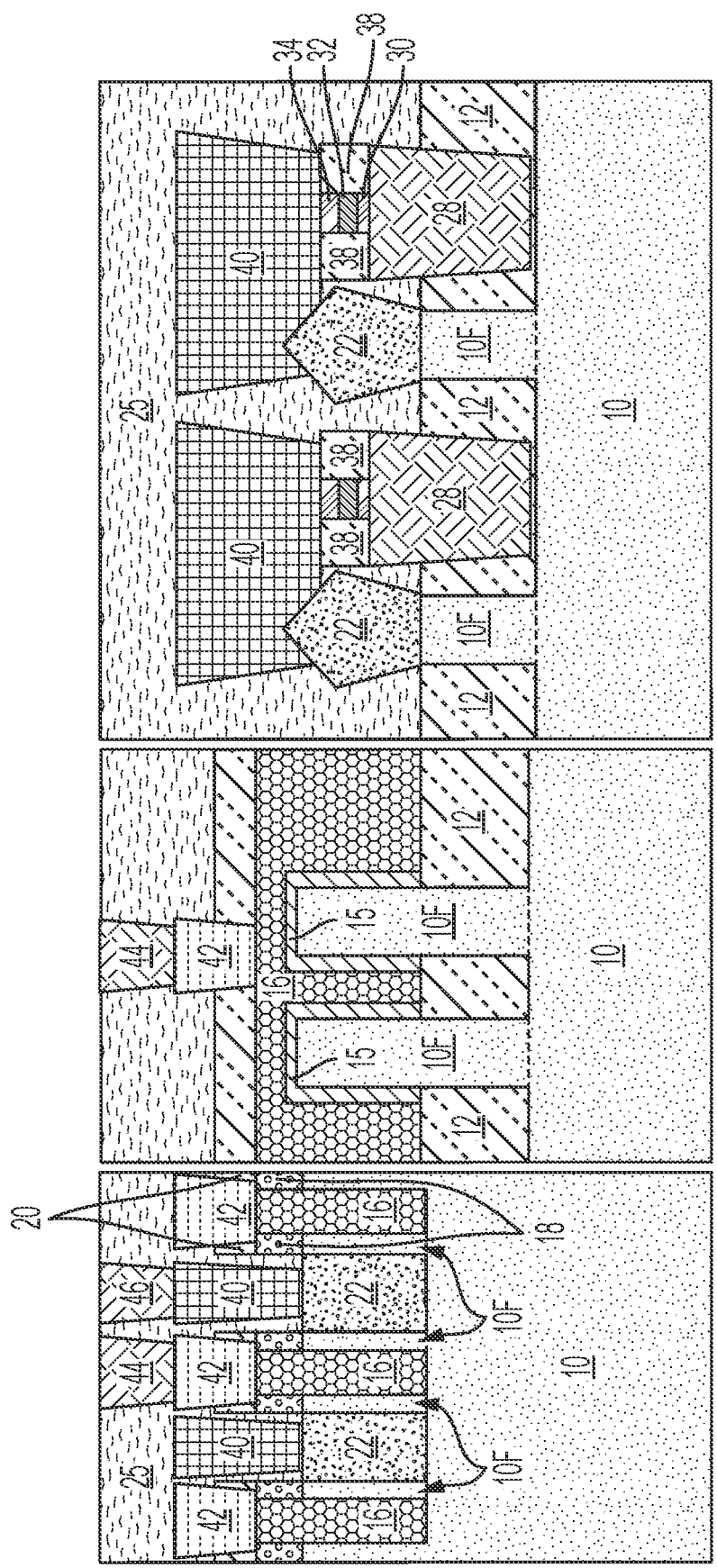

RESISTIVE RANDOM ACCESS MEMORY ON A BURIED BITLINE

BACKGROUND

The present application relates to semiconductor technology, and more particularly to a semiconductor structure including a resistive random access memory (ReRAM) located on a buried bitline.

Non-volatile memory (NVM) or non-volatile storage is a type of computer memory that can retain stored information even after the power is removed. In contrast, volatile memory needs constant power in order to retain data. NVMs, such as, for example, ReRAM (or sometime merely RRAM), phase change random access memory (PCRAM), and conductive bridge random access memory (CBRAM), are getting renewed attentions for potential applications to neuromorphic computing with in-memory processing capability which reduces power consumption significantly and eliminates data busing time between memory and the central processing unit (CPU) of conventional complementary metal oxide semiconductor (CMOS) based neuromorphic computing. ReRAM is considered as a promising technology for electronic synapse devices or memristors for neuromorphic computing as well as high-density and high-speed NVM applications. In neuromorphic computing applications, a resistance memory device such as ReRAM device can be used as a connection (i.e., synapse) between a pre-neuron and a post-neuron, representing the connection weight in form of device resistance.

SUMMARY

A semiconductor structure is provided that includes a ReRAM located on a surface of a bitline that is embedded in a shallow trench isolation structure. The structure can further include a source line that is present above the bitline or embedded in the shallow trench isolation structure.

In one aspect of the present application, a semiconductor structure is provided. In one embodiment, the semiconductor structure includes a buried bitline embedded in a shallow trench isolation structure, and a ReRAM located on a surface of the buried bitline, wherein the ReRAM is electrically connected to a source/drain region of at least one first transistor.

In the present application, the ReRAM and buried bitline are located in the same device level (i.e., the front-end-of-the-line (FEOL) level) as the transistors. Such a semiconductor structure including the buried bitline and ReRAM at the same device level has a significant resistance reduction (of approximately 5 times to 20 times) as compared to a conventional structure in which the ReRAM is located in the back-end-of-the-line (BEOL). Another advantage of such a structure is that improved bitline read and write operation can be obtained. A yet further advantage of such a structure is that it eliminates the need for forming a high number of metal stack writing levels for the bitline connection. An even further advantage is that a reduced IR (current-resistance) drop can be achieved enabling a large number of unit-cells in an array per block. In such embodiments, a larger memory book size can be achieved.

In embodiments of the present application, the ReRAM and the buried bitline are also embedded in an interlayer dielectric material structure that is present on the shallow trench isolation structure.

In embodiments of the present application, the at least one first transistor is a fin-type field effect transistor (finFET). In the present application, the finFET includes a semiconductor fin as a device channel structure and a gate structure located on an upper portion of the semiconductor fin, wherein a lower portion of the semiconductor fin is present in the shallow trench isolation structure. The present application is not limited to using finFETs, and thus other types of transistors including, for example, planar transistors, nanosheet transistors, or semiconductor nanowire transistors can be used.

In embodiments of the present application, the structure can further include a source line located above the at least one first transistor, wherein the source line is electrically connected to a source/drain region of at least one second transistor. In such embodiments, the ReRAM is electrically connected to the source/drain region of the at least one first transistor by a first source/drain contact structure, and the source line is electrically connected to the source/drain region of the at least one second transistor by a metal via structure and a second source/drain contact structure. In such embodiments, the buried bitline is connected to a sense amplifier, and the source line is connected to a common ground reference.

In embodiments of the present application, the structure can further include a buried source line embedded in the shallow trench isolation structure, wherein the buried source line is electrically connected to a source/drain region of at least one second transistor. In such embodiments, the ReRAM is electrically connected to the source/drain region of the at least one first transistor by a first source/drain contact structure, and the buried source line is electrically connected to the source/drain region of the at least one second transistor by a metal via structure and a second source/drain contact structure. In such embodiments, the buried bitline is connected to a sense amplifier, and the buried source line is connected to a common ground reference.

In any of the above mentioned embodiments, the at least one second transistor can be a finFET, planar transistor, nanosheet transistor, semiconductor nanowire transistor, etc.

In embodiments of the present application, the buried bitline extends beneath a topmost surface of a semiconductor substrate.

In embodiments of the present application, the buried bitline has an aspect ratio of 1:1 to 6:1. Such aspect ratios can provide a low resistance bitline.

In embodiments of the present application, the at least one first transistor includes a plurality of first transistors, and the ReRAM is electrically connected to a source/drain region of each first transistor of the plurality of first transistors.

In embodiments of the present application, the buried bitline is located in a region that is located adjacent to a first device region containing the at least one first transistor, and between the first device region and a second device region.

In embodiments of the present application, the buried bitline is a buried metal rail that has a length that is greater than a length of the ReRAM.

In another aspect of the present application, a memory array is provided. In one embodiment, the memory array includes a plurality of buried bitlines embedded in a shallow trench isolation structure, a ReRAM located on a surface of each of the buried bitlines of the plurality of buried bitlines, wherein the ReRAM is electrically connected to a source/drain region of each first transistor of a plurality of first transistors, and a plurality of source lines electrically connected to a source/drain region of each second transistor of a plurality of second transistors, wherein the plurality of first transistors are adjacent to the plurality of second transistors.

In embodiments of the present application, each source line of the plurality of source lines is present above the plurality of first transistors and the plurality of second transistors. In such embodiments, each buried bitline of the plurality of buried bitlines is connected to a sense amplifier, and each source line of the plurality of source lines is connected to a common ground reference.

In embodiments of the present application, each source line of the plurality of source lines is a buried source line embedded in the shallow trench isolation structure. In such embodiments, each buried bitline of the plurality of buried bitlines is connected to a sense amplifier, and each source line of the plurality of source lines is connected to a common ground reference.

BRIEF DESCRIPTION OF THE DRAWINGS

FIGS. 2A, 2B and 2C are cross sectional views through cuts X-X, Y1-Y1 and Y2-Y2 of FIG. 1, respectively, of an exemplary structure that can be employed in the present application, the exemplary structure including a plurality of semiconductor fins extending upwards from a surface of a semiconductor substrate, a shallow trench isolation structure located laterally adjacent to each semiconductor fin, a gate structure located on a first portion of each semiconductor fin, a source/drain region located on opposite sides of the gate structure and located on a second portion of each semiconductor fin, and a first interlayer dielectric material layer embedding at least each source/drain region.

FIGS. 3A, 3B and 3C are cross sectional views of the exemplary structure shown in FIGS. 2A, 2B and 2C, respectively, after forming a buried bitline in at least the shallow trench isolation structure.

FIGS. 4A, 4B and 4C are cross sectional views of the exemplary structure shown in FIGS. 3A, 3B and 3C, respectively, after forming a ReRAM stack on each buried bitline.

FIGS. 7A, 7B and 7C are cross sectional views of the exemplary structure shown in FIGS. 6A, 6B and 6C, respectively, after forming middle-of-the-line (MOL) contact structures, and metal via structures.

DETAILED DESCRIPTION

Figure 1:
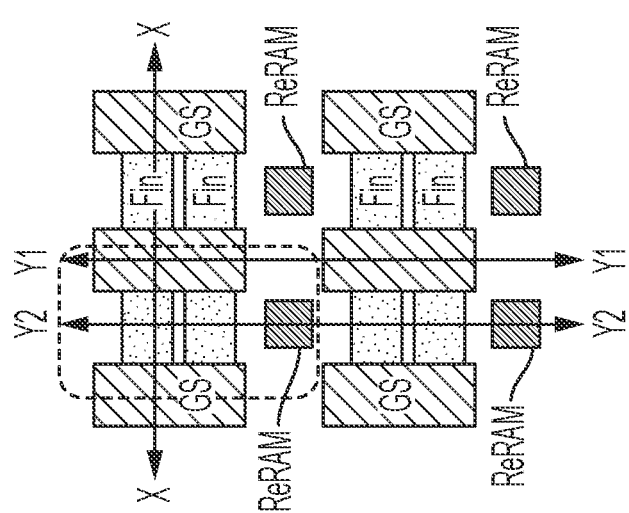
FIG. 1 is a top down view illustrating a device layout that is used in the present application for describing the semiconductor structure of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present application provides a semiconductor structure that includes a buried bitline embedded in a shallow trench isolation structure, and a ReRAM located on a surface of the buried bitline, wherein the ReRAM is electrically connected to a source/drain region of at least one first transistor. In the present application, the buried bitline and the ReRAM are both located in the same device level (i.e., FEOL level) as the transistors. The semiconductor structure of the present has a significant resistance reduction (of approximately 5 times to 20 times) as compared to a conventional structure in which the ReRAM is located in the BEOL. Another advantage of such a structure is that improved bitline read and write operation can be obtained. A yet further advantage of such a structure is that it eliminates the need for forming a high number of metal stack writing levels for the bitline connection. An even further advantage is that a reduced IR drop can be achieved enabling a large number of unit-cells in an array per block. In such embodiments, a larger memory book size can be achieved. These and other aspects/advantages of the present application will now be described in greater detail.

Reference is first made to FIG. 1, which is a top down view illustrating a device layout that is used in the present application for describing the semiconductor structure of the present application. The device layout includes a plurality of semiconductor fins. Each semiconductor fin is labeled in FIG. 1 as 'Fin'. The semiconductor fins are oriented parallel to each other. In FIG. 1, the two semiconductor fins located in an upper portion of the drawing are present in a first device region, while the two semiconductor fins located in a lower portion of the drawing are present in a second device region. These different device regions are separated by a region that includes a ReRAM. In the present application this region that is located between the two device region will also include a buried bitline (not shown) located beneath the ReRAM. FIG. 1 also includes cuts X-X. Y1-Y1 and Y2-Y2. Cut X-X is along a lengthwise direction and through one of the semiconductor fins, cut Y1-Y1 is along a lengthwise direction and through the middle gate structures, GS, shown in FIG. 1, and cut Y2-Y2 is in an area that is located between a neighboring pair of gate structures; in the two device regions this area will include source/drain regions. FIG. 1 also includes a dotted circle that highlights an area of the device layout that will be illustrated in FIGS. 2A-6C to follow.

It is noted that each of FIGS. 2A, 3A, 4A, 5A and 6A represents an exemplary structure through cut X-X, each of FIGS. 2B, 3B, 4B, 5B and 6B represents an exemplary structure through cut Y1-Y1, and each of FIGS. 2C. 3C, 4C, 5C and 6C represents an exemplary structure through cut Y2-Y2.

Referring now to FIGS. 2A, 2B and 2C, there are illustrated an exemplary structure through various cross sectional views (i.e., X-X-, Y1-Y1, and Y2-Y2, respectively) that can be employed in the present application. The exemplary structure includes a plurality of semiconductor fins 10F extending upwards from a surface of a semiconductor substrate 10, a shallow trench isolation structure 12 is located laterally adjacent to each semiconductor fin, 10F, a gate structure 16 is located on a first portion of each semiconductor fin 10F, a source/drain region 22 is located on opposite sides of the gate structure 16 and on a second portion of each semiconductor fin 10F and a first interlayer dielectric material layer 24 is present that embeds at least each source/drain region 22. Each gate structure 16 includes a gate dielectric material layer and a gate electrode. The gate dielectric material layer and the gate electrode are not separately shown in FIGS. 2A-2B, but both are included in the gate structure 16. The exemplary structure also includes gate spacers 18, a gate cap 20 and a dielectric material layer 15. The dielectric material layer 15 is composed of a dielectric material such as, for example, $SiO_2$, SiN or SiON. The dielectric material layer 15 protects the semiconductor fins 10F and thus can be referred to herein as a dielectric protection layer.

The semiconductor substrate 10 shown in FIGS. 2A, 2B and 2C is composed of at least one semiconductor material having semiconducting properties. Examples of semiconductor materials that can be used as the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors.

Each semiconductor fin 10F is also composed of a semiconductor material including those mentioned above for semiconductor substrate 10. The semiconductor material that provides each semiconductor fin 10F can be compositionally the same as, or compositionally different from, the semiconductor material that provides at least an upper portion of the semiconductor substrate 10. In embodiments in which the semiconductor material that provides each semiconductor fin 10F is compositionally the same as the semiconductor material that provides at least the upper portion of the semiconductor substrate 10, no material interface exists between the semiconductor fins 10F and the semiconductor substrate 10. In embodiments in which the semiconductor material that provides each semiconductor fin 10F is compositionally different from the semiconductor material that provides at least the upper portion of the semiconductor substrate 10, a material interface exists between the semiconductor fins 10F and the semiconductor substrate 10. In the drawings of the present application, a dotted line is shown between the semiconductor fins 10F and the semiconductor substrate 10 to illustrate a possible material interface that can exist between those two elements. Each semiconductor fin 10F can have a width from 5 nm to 25 nm, a height from 10 nm to 50 nm, and a length from 10 nm to 100 nm. The semiconductor fins 10F can be formed utilizing a patterning process such as, for example, sidewall image transfer (SIT), lithography and etching, or a self-assembly process in which self-assembled block copolymers are employed.

The shallow trench isolation structure 12 can include a trench dielectric material. The trench dielectric material can be composed of any trench dielectric such as, for example, silicon oxide. The shallow trench isolation structure 12 has a height that is less than a height of each semiconductor fin 10F. The shallow trench isolation structure 12 can be formed by deposition e.g., chemical vapor deposition (CVD), plasma enhanced chemical vapor deposition (PECVD) or physical vapor deposition (PVD)) and etching. In some embodiments, the shallow trench isolation structure 12 can extend beneath a topmost surface of the semiconductor substrate 10.

As mentioned above, the gate structure 16 includes gate dielectric material layer and a gate electrode, both of which are not separately shown in the drawings, but intended to be within region defined by the gate structure 16. The gate structure 16 is a component of a transistor; the transistor further includes source/drain regions 22 located on each side of the gate structure 16. As is known to those skilled in the art, the gate dielectric material layer directly contacts a physically exposed surface(s) of each semiconductor fin 10F, and the gate electrode is formed on the gate dielectric material layer. The gate dielectric material layer of the gate structure 16 is composed of a gate dielectric material having a dielectric constant of 4.0 or greater. All dielectric constants mentioned herein are measured in a vacuum unless otherwise indicated. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as La, Al and/or Mg.

The gate electrode of the gate structure 16 can include a conductive metal and an optional work function metal (WFM). The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the WFM-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The conductive metal that provide the gate electrode can include, but is not limited to, Al, W, or Co. The gate structure 16 can be formed utilizing a gate first process or a gate-last process (in a gate last process, sacrificial gate structures are formed first and then after further device processing the sacrificial gate structure can be replaced with the gate structure 16).

In the present application, the transistor mentioned above is a fin-type field effect transistor (finFET), the finFET includes the semiconductor fin 10F as a device channel structure and the gate structure 16 is located on an upper portion of the semiconductor fin 10F, wherein a lower portion of the semiconductor fin 10F is present in the shallow trench isolation structure 12 as is shown in FIG. 2B. Although the present application describes finFETs being used, other types of transistors including, for example, planar transistors, nanosheet transistors, or semiconductor nanowire transistors can be used.

The gate spacers 18 are composed of any gate dielectric material such as, for example, $SiO_x$, SIN, SiBCN, SiOCN, SiON or SiOC. The gate spacers 18 can be formed by deposition and etching. Each gate cap 20 can be composed of a dielectric hard mask material such as, for example, SiN and/or SiON. Each gate cap 20 can be formed by deposition, followed by chemical mechanical polishing (CMP).

The source/drain regions 22 include a semiconductor material and a dopant. As used herein, a "source/drain or S/D" region can be a source region or a drain region depending on subsequent wiring and application voltage during operation of the transistor. The dopant can be either an n-type dopant or a p-type dopant, both as defined herein below. The semiconductor material that provides source/drain regions 22 includes one of the semiconductor materials mentioned above in providing the semiconductor substrate 10. The semiconductor material that provides the source/drain regions 22 can be compositionally the same as, or compositionally different from, the semiconductor material that provides each semiconductor fin 10F. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of the n-type or p-type dopant in the source/drain regions 22 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived. Note that the source/drain regions 22 are typically formed utilizing an epitaxial growth process such that the source/drain regions 22 have a same crystal orientation as that of the growth surface of the semiconductor fin 10F that that they formed thereon.

The first interlayer dielectric material layer 24 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. The first interlayer dielectric material layer 24 can be formed by a deposition process such as, for example, CVD, PECVD or spin-on coating.

The exemplary structure shown in FIGS. 2A, 2B and 2C can be formed utilizing any finFET processing technique that is well known in the art. So as to not obscure the method of the present application, the details concerning finFET processing is not described in greater detail herein.

Referring now to FIGS. 3A, 3B and 3C, there are illustrated the exemplary structure shown in FIGS. 2A, 2B and 2C, respectively, after forming a buried bitline 28 (two of which are shown by way of one example in FIG. 3C) in at least the shallow trench isolation structure 12. The buried bitline 28 is formed in the region that is located between the two device regions mentioned above in connection with the device layout shown in FIG. 1. In some embodiments (not shown in FIG. 3C) the buried bitline 28 can be entirely embedded in the shallow trench isolation structure 12 such that a topmost surface of the buried bitline 28 is coplanar with, or located beneath, a topmost surface of the shallow trench isolation structure 12. In some embodiments (and as is shown in FIG. 3C), the buried bitline 28 is embedded in both the shallow trench isolation structure 12 and the first interlayer dielectric material layer 24. In such an embodiment, the buried bitline 28 has a topmost surface that is located between a topmost surface and a bottommost surface of the first interlayer dielectric material layer 24. In some embodiments (not shown in FIGS. 3A, 3B and 3C), the buried bitline 28 can extend beneath a topmost surface of the semiconductor substrate 10. This aspect of the present application is shown, for example, in FIGS. 8 and 12.

The buried bitline 28 (which serves as a power rail in the present application) is composed of any electrically conductive metal-containing material including, but not limited to, W, Co, Ru, Al, Cu, Pr, Rh or Pb. A thin metal adhesion layer (such as TiN or TaN) can be present along a bottom wall and sidewalls of the electrically conductive metal-containing material that provides the buried bitline 28. The buried bitline 28 can be formed by forming an opening 26 into the first interlayer dielectric material layer 24 and a portion of the shallow trench isolation structure 12. Opening 26 can be formed by lithography and etching. At least one of the electrically conductive metal-containing materials mentioned above is then deposited into the opening, and a recess etch can follow the deposition of the electrically conductive metal-containing material. The depositing of the electrically conductive metal-containing material can include CVD, PECVD, atomic layer deposition (ALD), sputtering or plating.

In some embodiments of the present application, the buried bitline 28 has an aspect ratio of 1:1 to 6:1. The term "aspect ratio" is used throughout the present application to denote the ratio of a height of the buried bitline 28 to a width of the buried bitline 28. The aspect ratio reported herein is a high aspect ratio that is beneficial for providing a low resistance bitline.

Figure 8:
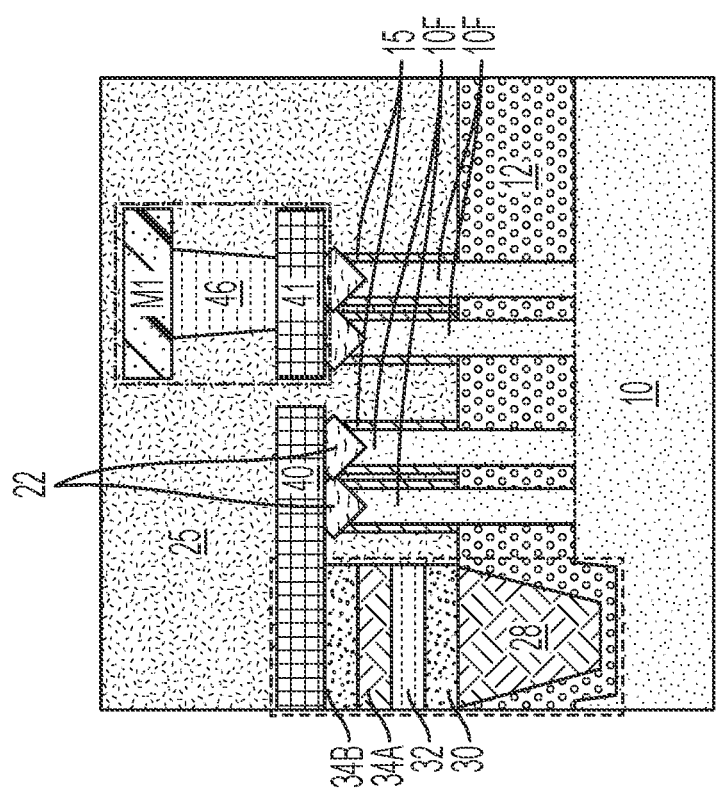
FIG. 8 is a cross sectional view illustrating a ReRAM structure in accordance with an embodiment of the present application.
Figure 12:
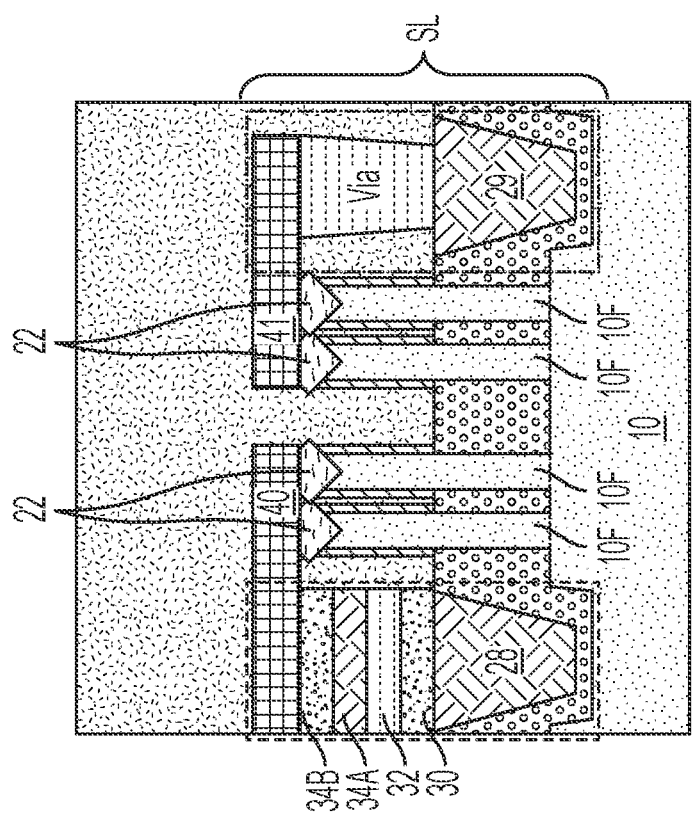
FIG. 12 is a cross sectional view illustrating a ReRAM structure in accordance with an embodiment of the present application.

Referring now to FIGS. 4A, 4B and 4C, there are illustrated the exemplary structure shown in FIGS. 3A, 3B and 3C, respectively, after forming a ReRAM stack on each buried bitline 28. The ReRAM stack includes a first electrode 30, a filament forming layer 32 (which can also be referred to herein as a dielectric switching layer), and a second electrode 34. The first electrode 30 can be composed of an electrically conductive material such as, for example, Ta, TaN, Ti, TiN, Ru, RuN, RuTa, RuTaN, Cu, Co, CoWP, CON, W, WN or any combination thereof. The first electrode 30 can have a thickness from 2 nm to 80 nm; other thicknesses are possible and can be used in the present application as the thickness of the first electrode 30. The filament forming layer 32 is composed of a dielectric material such as a dielectric metal oxide that has a dielectric constant of 4.0 or greater. The filament forming layer 32 is electrically insulating at this point of the present application and during operational use, a filament which is electrically conducting can be formed in the filament forming layer 32. Examples of dielectric metal oxides that can be employed as the filament forming layer 32 include, but are not limited to, hafnium oxide, tantalum oxide, titanium oxide, aluminum oxide, silicon dioxide or combinations thereof. In some embodiments, hydrogen can be present in the dielectric material that provides the filament forming layer 32. The filament forming layer 32 can have a thickness from 1 nm to 50 nm; other thicknesses however are contemplated can be used as the thickness of the filament forming layer 32. The second electrode 34 can include one of electrically conductive materials mentioned above for the first electrode 30. The second electrode 34 can include a bilayer electrode stack such as is shown in FIG. 8 and FIG. 12 of a lower second electrode 34A and an upper second electrode 34B. In some embodiments, the electrically conductive material that provides the second electrode 34 is compositionally the same as the electrically conductive material that provides the first electrode 30. In one example, the electrically conductive material that provides both the first electrode 30 and the second electrode 34 is composed of TiN. In other embodiments, the electrically conductive material that provides the second electrode 34 is compositionally different than the electrically conductive material that provides the first electrode 30. In one example, the electrically conductive material that provides the first electrode 30 is composed of TaN and the electrically conductive material that provides the second electrode 34 is composed of TiN. A hard mask cap 36 is present on the second electrode 34. The hard mask cap 36 is composed of a hard mask material such as, for example, SiN or SiON.

The ReRAM stack and the hard mask cap 36 are formed by deposition (e.g., CVD, PECVD, or ALD) followed by a planarization process such as, for example, CMP. The planarization process removes any of the ReRAM stack and the hard mask cap 36 that are formed outside of the opening 26. At this point of the present application, the first electrode 30, the filament forming layer 32, and the second electrode 34 of the ReRAM stack are U-shaped and each has a topmost surface that is coplanar with each other. These coplanar topmost surfaces of the ReRAM stack are coplanar with a topmost surface of the hard mask cap 36.

Figures 5A, 5B, 5C:
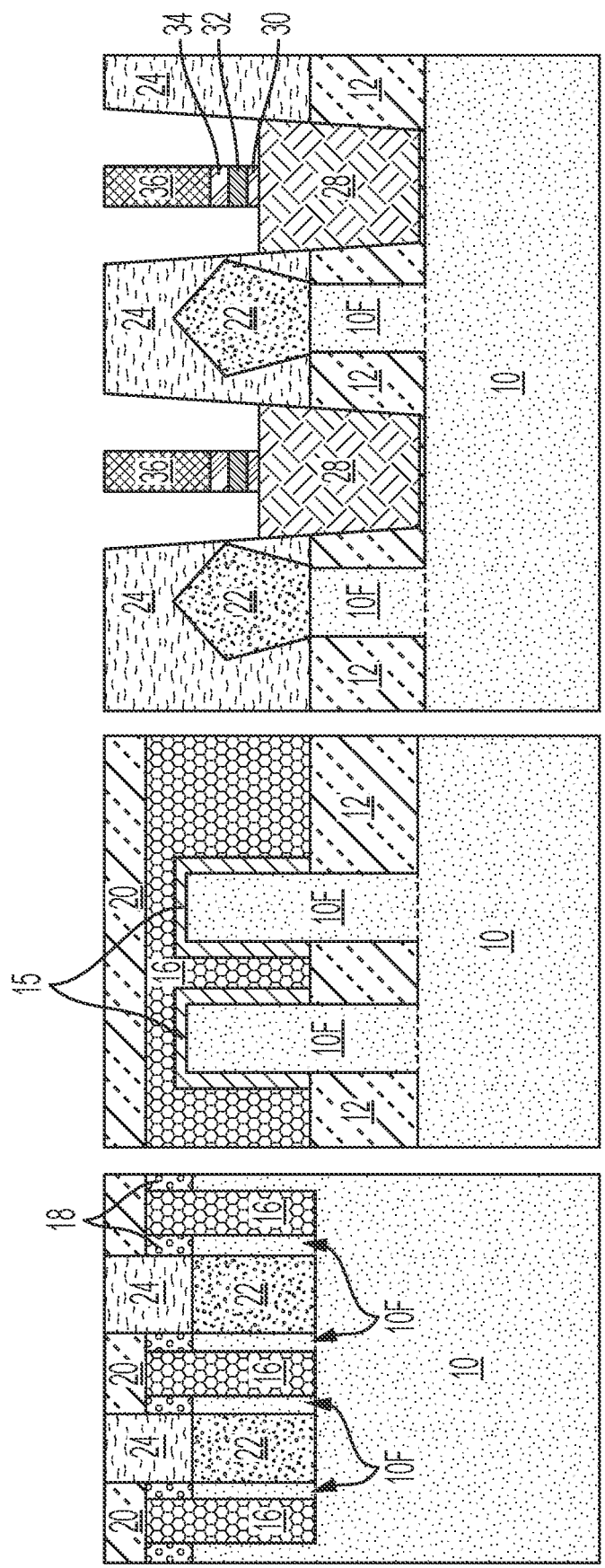
FIGS. 5A, 5B and 5C are cross sectional views of the exemplary structure shown in FIGS. 4A, 4B and 4C, respectively, after patterning the ReRAM stack to provide a ReRAM.

Referring now to FIGS. 5A, 5B and 5C, there are illustrated the exemplary structure shown in FIGS. 4A, 4B and 4C, respectively, after patterning the ReRAM stack to provide a ReRAM. The ReRAM includes remaining (i.e., non-etched) portions of the ReRAM stack including remaining (non-etched) portions of the first electrode 30, filament forming layer 32, and the second electrode 34. These remaining (non-etched) portions of the first electrode 30, filament forming layer 32, and the second electrode 34 are stacked one atop the other to provide a pillar shaped ReRAM as shown in FIG. 5C. Some tapering can be present in the pillar shaped ReRAM that is formed during this patterning step. A remaining (non-etched) portion of the hard mask cap 36 is present on top of the pillar shaped ReRAM as shown in FIG. 5C. The patterning of the ReRAM stack and hard mask cap 36 includes lithography and etching. It is noted that the pillar shaped ReRAM that is formed is present only on a portion of the underlying buried bitline 28; a remaining portion of the buried bitline 28 would extend into and out of the drawing sheet including FIGS. 5A, 5B and 5C. In embodiments of the present application, the buried bitline 28 is a buried metal rail that has a length that is greater than a length of the pillar shaped ReRAM.

Figures 6A, 6B, 6C:
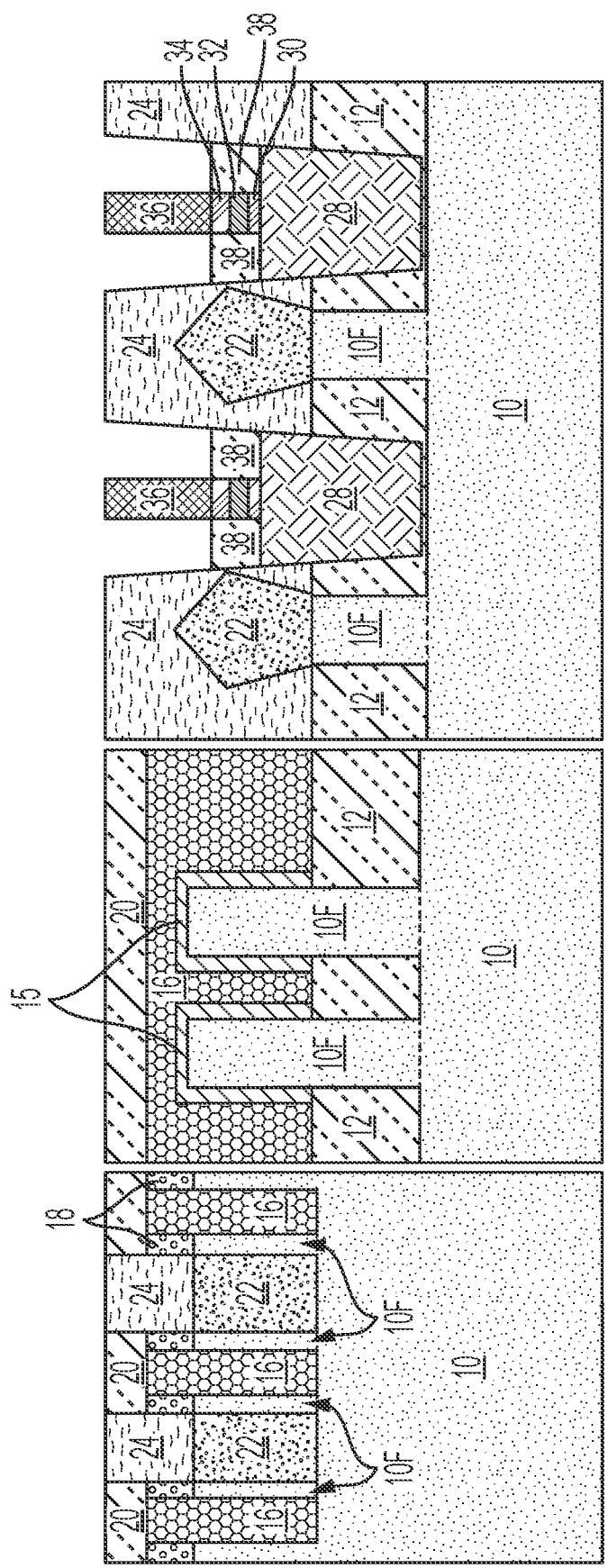
FIGS. 6A, 6B and 6C are cross sectional views of the exemplary structure shown in FIGS. 5A, 5B and 5C, respectively, after forming a ReRAM spacer protecting a sidewall of the ReRAM.

Referring now to FIGS. 6A, 6B and 6C, there are illustrated the exemplary structure shown in FIGS. 5A, 5B and 5C, respectively, after forming a ReRAM spacer 38 protecting a sidewall of the ReRAM. As is shown in FIG. 6C, the ReRAM spacer 38 laterally surrounds the ReRAM and is present on physically exposed portions of the buried bitline 28 and covers an entirety of the sidewall of the ReRAM. The ReRAM spacer 38 thus has a topmost surface that is coplanar with the remaining (i.e. non-etched) portion of the top electrode 34 of the pillar shaped ReRAM shown in FIG. 6C. The ReRAM spacer 38 is composed of any dielectric spacer material including, for example, silicon dioxide or silicon nitride, and the ReRAM spacer 38 can be formed by deposition of the dielectric spacer material, followed by a recess etch.

Referring now to FIGS. 7A, 7B and 7C, there are illustrated the exemplary structure shown in FIGS. 6A, 6B and 6C, respectively, after forming MOL contact structures, and metal via structures. The MOL contact structures include source/drain contact structures 40 and gate contact structures 42. The source/drain contact structures 40 are formed on physically exposed surfaces of the source/drain regions 22 as is shown in FIG. 7A, while the gate contact structures 42 are formed on physically exposed surface of the gate structure as is also shown in FIG. 7A. As is shown in FIG. 7C, the pillar shaped ReRAM that is present on the buried bitline 28 is electrically connected to one of the source/drain regions of a transistor by means of one of the source/drain contact structures 40. During formation of the MOL contacts, the remaining (i.e., non-etched) portion of the hard mask cap 36 is removed to reveal a topmost surface of the ReRAM. Notably, a topmost surface of the second electrode 34 of the ReRAM is now physically exposed and one of source/drain contact structures 40 is in physically contact with the revealed topmost surface of the ReRAM; this one source/drain contact structure 40 also is in physical contact with the source/drain region as is shown in FIG. 7C.

The metal via structures include a first metal via structure 44, and a second metal via structure 45. The first metal via structure 44 contacts one of the gate contact structures 42, while the second metal via structure 45 contacts one of the source/drain contact structures 40. The metal via structures are embedded in an upper portion of an interlayer dielectric material structure 25 that includes the first interlayer dielectric material layer 24 and at least one additional interconnect dielectric material layer formed on the first interlayer dielectric material layer 24. The least one additional interconnect dielectric material layer includes one of the dielectric material mentioned above for the first interlayer dielectric material layer 24. The at least one additional interlayer dielectric material layer can be formed utilizing a deposition process such as, for example, CVD, PECVD or spin-on-coating.

The source/drain contact structures 40 and the gate contact structures 42 are composed of at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The source/drain contact structures 40 and the gate contact structures 42 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TIN and Ti/WC. In one or more embodiments in which a contact liner is present, the contact liner (not shown) can include a silicide liner, such as Ti, Ni, NiPt, etc., and a diffusion barrier material, as defined above. The source/drain contact structures 40 and the gate contact structures 42 can be formed by forming a gate contact opening that physically exposes the gate structure 16 and a source/drain contact opening that physically exposes the source/drain regions 22. These openings are then filled with at least a contact conductor material as mentioned above, and a planarization process is then performed to provide the source/drain contact structures 40 and the gate contact structures 42.

The metal via structures including the first metal via structure 44, and the second metal via structure 45 are then formed by first forming the least one additional interlayer dielectric material layer on the first interlayer dielectric material layer 34, and a metallization process that includes via opening formation and filling of the via opening with an electrically conductive metal or metal alloy. Exemplary electrically conductive metals that can be used in providing the metal via structures include, but at not limited to, Cu, W, Al, or Co, while exemplary electrically conductive metal alloys that can be used in providing the metal via structures include a Cu—Al alloy or a Cu—W alloy.

Notably, FIGS. 7A-7C illustrates a semiconductor structure in accordance with an embodiment of the present application. The illustrated semiconductor structure includes buried bitline 28 embedded in shallow trench isolation structure 12, and ReRAM 30/32/34 is located on a surface of the buried bitline 28, wherein the ReRAM 30/32/34 is electrically connected to one of the source/drain regions 22 of at least one first transistor. In the present application, the first transistor, the ReRAM 30/32/34 and the buried bitline 28 are located in the same device level (i.e., FEOL level).

After forming the exemplary semiconductor structure shown in FIGS. 7A, 7B and 7C, a BEOL structure (not shown) and a carrier wafer (also not shown) can be formed. The BEOL structure includes various metal levels, M1, M2, etc. The various metal levels include electrically conductive structures (metal lines and vias) that are embedded in an interconnect dielectric material layer.

Referring now to FIG. 8, there is illustrated a ReRAM structure in accordance with an embodiment of the present application. The ReRAM structure includes the various components mentioned above in regarding to FIGS. 2A-7C. Notably, the ReRAM structure includes buried bitline 28 embedded in shallow trench isolation structure 12, and ReRAM 30/32/34A/34B is located on a surface of the buried bitline 28, wherein the ReRAM 30/32/34A/34B is electrically connected to one of the source/drain regions 22 of at least one first transistor (here the ReRAM is electrically connected to the source/drain region of each first transistor of a plurality of first transistors). This ReRAM structure further includes a source line, SL, located above the at least one first transistor, wherein the source line, SL, is electrically connected to a source/drain region 22 of at least one second transistor. Here SL is at M1, and thus SL is located in the BEOL. This source line is electrically connected to the source/drain region 22 of the at least one second transistor by metal via structure 46 and a second source/drain contact structure 41. The source lines can be composed of an electrically conductive metal or an electrically conductive metal alloy. In one example, the source line is composed of Cu or W.

Figure 9:
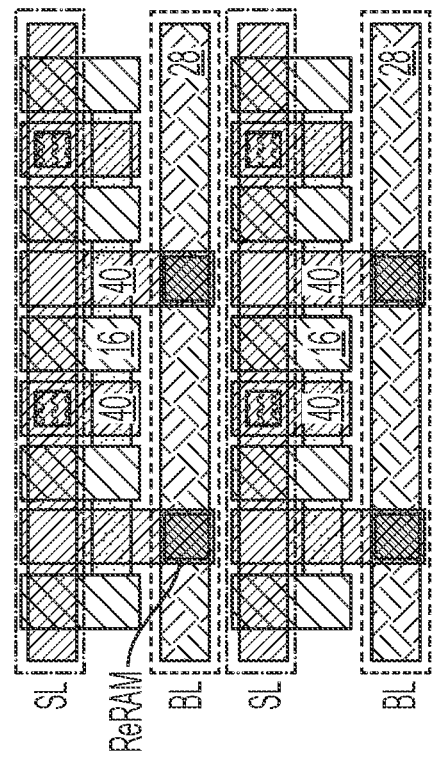
FIG. 9 is a top down view of a memory array in accordance with an embodiment of the present application that includes a plurality of ReRAM structures as shown in FIG. 8.

Referring now to FIG. 9, there is illustrated a top down view of a memory array in accordance with an embodiment of the present application that includes a plurality of ReRAM structures as shown in FIG. 8. Notably, FIG. 9 shows the continuous buried bitlines 28 running horizontally with ReRAM devices located on them. In the regions where the ReRAM devices are formed, the memory cell extends to a neighboring SL. The gate structures 16 are perpendicularly oriented with respect to the BL/SLs. The source/drain contact structures 40 are middle-of-the-line connections. A key feature of this embodiment is that the buried bitlines 28 are buried while the source lines are located at the M1 level.

Figure 10:
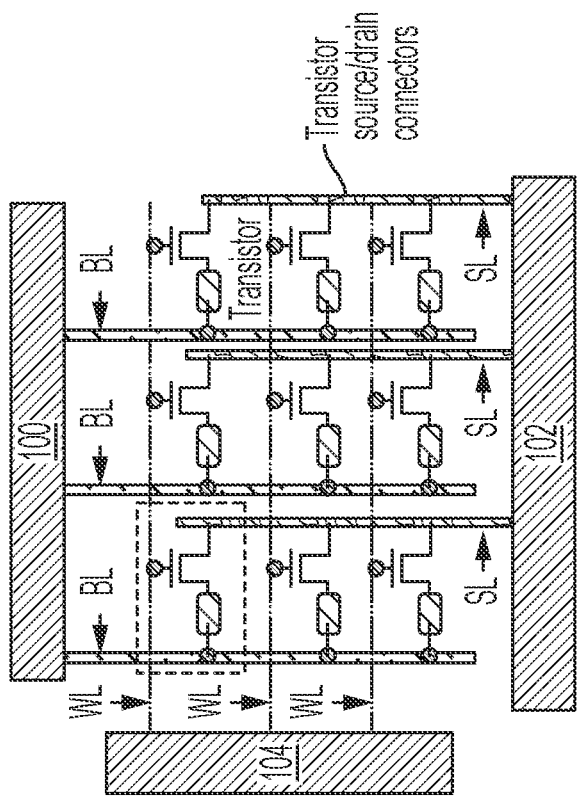
FIG. 10 is a top down view of a multiple resistive memory array in accordance with an embodiment of the present application that includes a plurality of ReRAM structures as shown in FIG. 8.

Referring now to FIG. 10, there is illustrated a top down view of a multiple resistive memory array in accordance with an embodiment of the present application that includes a plurality of ReRAM structures as shown in FIG. 8. Notably, FIG. 10 shows the buried bitlines 28 containing the memory elements as well as the M1 source lines, SL, running in the same orientation. Here, the transistor source/drain connections to the ReRAM devices and to the gate structures 16. In this embodiment, unlike FIG. 9, two source lines are adjacent to one another, with each pair of source lines separated by a buried bitline 28.

Figure 11:
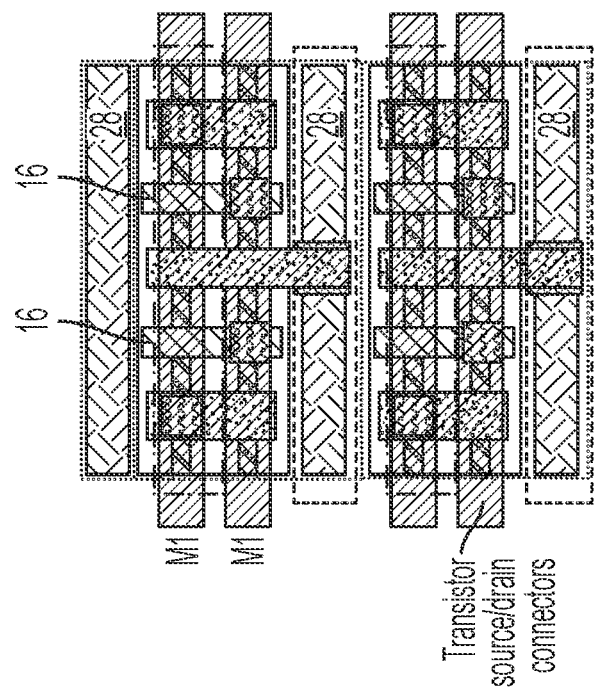
FIG. 11 is a circuit diagram of the multiple resistive memory array shown in FIG. 10.

Referring now to FIG. 11, there is shown a circuit diagram of the multiple resistive memory array shown in FIG. 10. In this drawing. WL refers to a wordline which is the gate electrode of each gate structure, and BL represents a bitline which in the present application is buried bitline 28. In this drawing, each WL is wired to a wordline decoder and driver 104, and each SL is wired to a common reference source 102. Notably, FIG. 11 is a memory cell design with the salient features that BL and the SL run in the same direction, with being buried while the other is at M1. Both the BL and the SL are perpendicular to the WL, which may be located at a higher metal level than M1.

Referring now to FIG. 12, there is illustrated a ReRAM structure in accordance with an embodiment of the present application. This ReRAM structure includes the various components mentioned above in regarding to FIGS. 2A-7C. Notably, this ReRAM structure includes buried bitline 28 embedded in shallow trench isolation structure 12, and ReRAM 30/32/34A/34B is located on a surface of the buried bitline 28, wherein the ReRAM 30/32/34A/34B is electrically connected to one of the source/drain regions 22 of at least one first transistor (here the ReRAM is electrically connected to a source/drain region of each first transistor of a plurality of first transistors). This ReRAM structure further includes a SL located at a same level as the first transistor, wherein the SL is electrically connected to a source/drain region 22 of at least one second transistor. Here SL is equal to buried line 29. Buried line 29 includes materials as mentioned above for buried bitline 28, and it is present in at least the shallow trench isolation structure 12. This source line SL is electrically connected to the source/drain region 22 of the at least one second transistor by a metal via (via) and second source/drain contact structure 41.

Figure 13:
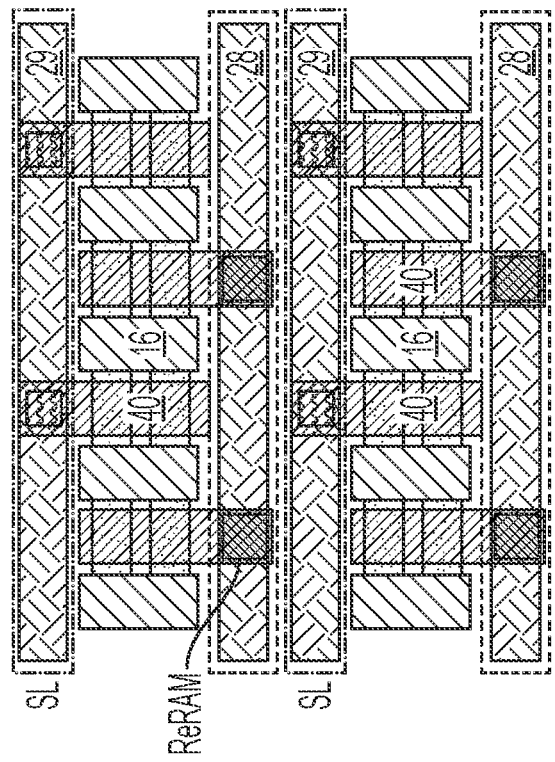
FIG. 13 is a top down view of a memory array in accordance with an embodiment of the present application that includes a plurality of ReRAM structures as shown in FIG. 12.

Referring now to FIG. 13, there is illustrated a top down view of a memory array in accordance with an embodiment of the present application that includes a plurality of ReRAM structures as shown in FIG. 12. The memory array shown in FIG. 13 is similar to the memory array shown in FIG. 9 except that in this drawing both the BL and the SL are buried below the transistor, while in FIG. 9 the BL is buried and the SL is at M1.

Figure 14:
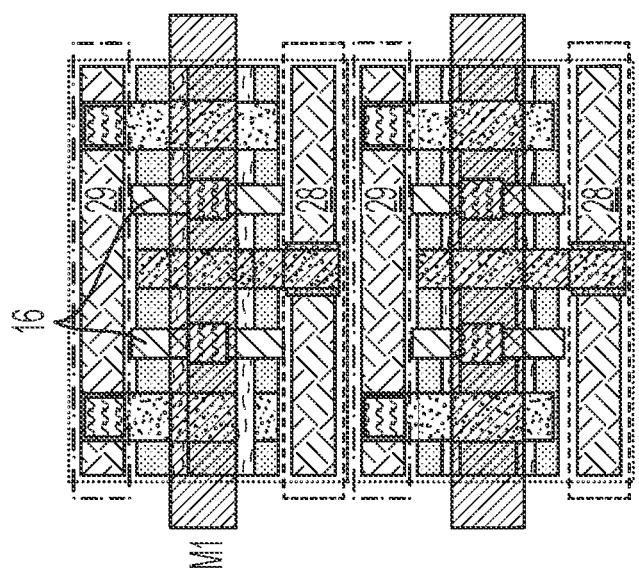
FIG. 14 is a top down view of a multiple resistive memory array in accordance with an embodiment of the present application that includes a plurality of ReRAM structures as shown in FIG. 12.

Referring now to FIG. 14, there is illustrated a top down view of a multiple resistive memory array in accordance with an embodiment of the present application that includes a plurality of ReRAM structures as shown in FIG. 12. The memory array is similar to the memory array illustrated in FIG. 10. The difference between the memory array shown in FIG. 14 and the memory array shown in FIG. 10 is that in FIG. 14 a M1 track is present between the buried bitline 28 and the source line 29 connecting to the device level, while in FIG. 10 the M1 track is omitted.

Figure 15:
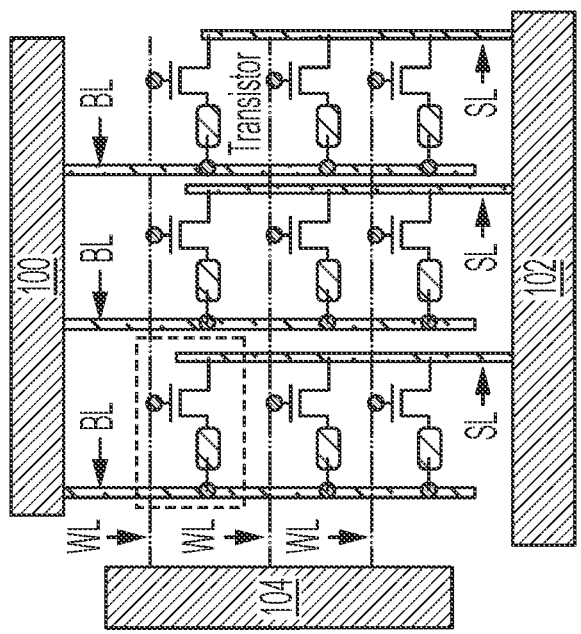
FIG. 15 is a circuit diagram of the multiple resistive memory array shown in FIG. 14.

Referring now to FIG. 15, there is illustrated a circuit diagram of the multiple resistive memory array shown in FIG. 14. In this drawing, WL refers to a wordline which is the gate electrode of each gate structure, and BL represents a bitline which in the present application is buried bitline 28. In this drawing, each WL is wired to a wordline decoder and driver 104, and each SL is wired to a common reference source 102. This circuit diagram is similar to the circuit diagram shown in FIG. 11 above. The major difference between this circuit diagram and the one depicted in FIG. 11 is that in FIG. 15 both the BL and the SL are buried, while in FIG. 11 the BL was buried and the SL is at M1.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a buried bitline embedded in a shallow trench isolation structure; and
a resistive random access memory (ReRAM) located on a surface of the buried bitline, wherein the ReRAM is electrically connected to a source/drain region of at least one first transistor.

2. The semiconductor structure of claim 1, wherein the ReRAM and the buried bitline are also embedded in an interlayer dielectric material structure that is present on the shallow trench isolation structure.

3. The semiconductor structure of claim 1, wherein the at least one first transistor is a fin-type field effect transistor (finFET), the finFET comprising a semiconductor fin as a device channel structure and a gate structure located on an upper portion of the semiconductor fin, wherein a lower portion of the semiconductor fin is present in the shallow trench isolation structure.

4. The semiconductor structure of claim 1, further comprising a source line located above the at least one first transistor, wherein the source line is electrically connected to a source/drain region of at least one second transistor.

5. The semiconductor structure of claim 4, wherein the ReRAM is electrically connected to the source/drain region of the at least one first transistor by a first source/drain contact structure, and the source line is electrically connected to the source/drain region of the at least one second transistor by a metal via structure and a second source/drain contact structure.

6. The semiconductor structure of claim 4, wherein the buried bitline is connected to a sense amplifier, and the source line is connected to a common ground reference.

7. The semiconductor structure of claim 1, further comprising a buried source line embedded in the shallow trench isolation structure, wherein the buried source line is electrically connected to a source/drain region of at least one second transistor.

8. The semiconductor structure of claim 7, wherein the ReRAM is electrically connected to the source/drain region of the at least one first transistor by a first source/drain contact structure, and the buried source line is electrically connected to the source/drain region of the at least one second transistor by a metal via structure and a second source/drain contact structure.

9. The semiconductor structure of claim 8, wherein the at least one second transistor is a finFET.

10. The semiconductor structure of claim 7, wherein the buried bitline is connected to a sense amplifier, and the buried source line is connected to a common ground reference.

11. The semiconductor structure of claim 1, wherein the buried bitline extends beneath a topmost surface of a semiconductor substrate.

12. The semiconductor structure of claim 1, wherein the buried bitline has an aspect ratio of 1:1 to 6:1.

13. The semiconductor structure of claim 1, wherein the at least one first transistor comprises a plurality of first transistors, and the ReRAM is electrically connected to a source/drain region of each first transistor of the plurality of first transistors.

14. The semiconductor structure of claim 1, wherein the buried bitline is located in a region that is located adjacent to a first device region containing the at least one first transistor, and between the first device region and a second device region.

15. The semiconductor structure of claim 1, wherein the buried bitline is a buried metal rail that has a length that is greater than a length of the ReRAM.

16. A memory array comprising:
a plurality of buried bitlines embedded in a shallow trench isolation structure;
a resistive random access memory (ReRAM) located on a surface of each of the buried bitlines of the plurality of buried bitlines, wherein the ReRAM is electrically connected to a source/drain region of each first transistor of a plurality of first transistors; and
a plurality of source lines electrically connected to a source/drain region of each second transistor of a plurality of second transistors, wherein the plurality of first transistors are adjacent to the plurality of second transistors.

17. The memory array of claim 16, wherein each source line of the plurality of source lines is present above the plurality of first transistors and the plurality of second transistors.

18. The memory array of claim 17, wherein each buried bitline of the plurality of buried bitlines is connected to a sense amplifier, and each source line of the plurality of source lines is connected to a common ground reference.

19. The memory array of claim 16, wherein each source line of the plurality of source lines is a buried source line embedded in the shallow trench isolation structure.

20. The memory array of claim 19, wherein each buried bitline of the plurality of buried bitlines is connected to a sense amplifier, and each source line of the plurality of source lines is connected to a common ground reference.

* * * * *